(12) United States Patent
Chen et al.

(10) Patent No.: US 10,157,940 B2
(45) Date of Patent: Dec. 18, 2018

(54) METHOD FOR MANUFACTURING LTPS ARRAY SUBSTRATE

(71) Applicant: WUHAN CHINA STAR OPTOELECTRONICS TECHNOLOGY CO., LTD., Wuhan, Hubei (CN)

(72) Inventors: Yuxia Chen, Hubei (CN); Chao He, Hubei (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 57 days.

(21) Appl. No.: 15/323,978

(22) PCT Filed: Jun. 12, 2016

(86) PCT No.: PCT/CN2016/085491
§ 371 (c)(1),
(2) Date: Jan. 5, 2017

(87) PCT Pub. No.: WO2017/173727
PCT Pub. Date: Oct. 12, 2017

(65) Prior Publication Data
US 2018/0182785 A1    Jun. 28, 2018

(30) Foreign Application Priority Data
Apr. 5, 2016    (CN) .......................... 2016 1 0206147

(51) Int. Cl.
*H01L 27/12* (2006.01)
*H01L 21/02* (2006.01)
(Continued)

(52) U.S. Cl.
CPC ...... *H01L 27/1274* (2013.01); *H01L 21/0274* (2013.01); *H01L 21/02488* (2013.01);
(Continued)

(58) Field of Classification Search
None
See application file for complete search history.

(56) References Cited

U.S. PATENT DOCUMENTS 5,371,025 A    12/1994  Sung
5,909,615 A *   6/1999  Kuo .................. H01L 29/6675
                                              257/241
(Continued)

FOREIGN PATENT DOCUMENTS

CN    1158406 A    9/1997
CN    1525554 A    9/2004
CN    102130009 A   7/2011

*Primary Examiner* — Asok K Sarkar
(74) *Attorney, Agent, or Firm* — Soroker Agmon Nordman

(57) ABSTRACT

The present invention provides a manufacturing method of LTPS array substrate, wherein the LTPS array substrate contains at least a metal mask layer, a buffer layer, an active layer, a gate insulating layer and a gate layer. The manufacturing method is to form the gate layer by patterning the gate layer using the metal mask layer as a photomask, and a width of the formed gate layer is smaller than a width of the metal mask layer so that a vertical projection of the gate layer falls within the scope of the metal mask layer. In the present invention, the cost of producing a metal mask for the gate electrode is saved by patterning the gate layer using the metal mask layer as a photomask, so that the cost of producing LTPS is saved and the process of production is simplified.

14 Claims, 7 Drawing Sheets

(51) Int. Cl.
*H01L 21/027* (2006.01)
*H01L 21/265* (2006.01)
*H01L 21/3213* (2006.01)
*H01L 29/66* (2006.01)
*H01L 29/786* (2006.01)

(52) U.S. Cl.
CPC .. *H01L 21/02491* (2013.01); *H01L 21/02502* (2013.01); *H01L 21/02532* (2013.01); *H01L 21/02592* (2013.01); *H01L 21/02675* (2013.01); *H01L 21/02686* (2013.01); *H01L 21/26513* (2013.01); *H01L 21/32135* (2013.01); *H01L 21/32139* (2013.01); *H01L 27/12* (2013.01); *H01L 27/1218* (2013.01); *H01L 27/1222* (2013.01); *H01L 27/1288* (2013.01); *H01L 29/66757* (2013.01); *H01L 29/78621* (2013.01)

(56) References Cited

U.S. PATENT DOCUMENTS

| | | | |
|---|---|---|---|
| 6,022,764 | A | 2/2000 | Park et al. |
| 9,129,992 | B2 | 9/2015 | Zhang |
| 2003/0230748 | A1* | 12/2003 | Shih ................. G02F 1/136209 257/59 |
| 2005/0112807 | A1* | 5/2005 | Koo ................. H01L 29/66757 438/151 |
| 2018/0059456 | A1* | 3/2018 | Wan ..................... G02F 1/1368 |
| 2018/0076330 | A1* | 3/2018 | Morosawa ........ H01L 29/41733 |

* cited by examiner

METHOD FOR MANUFACTURING LTPS ARRAY SUBSTRATE

FIELD OF THE INVENTION

The present invention relates to the field of liquid crystal displays, and in particular, to a method for manufacturing LTPS array substrate.

BACKGROUND OF THE INVENTION

With the growing popularity of mobile displays, a new generation of display technology is developing in high-definition, high resolution, slim and low power consumption. Low Temperature Poly-silicon (LTPS) technology is popular with consumers due to its high image quality, high resolution, super-thin design and low power consumption. Hence, the LTPS technology is taking the place of the conventional a-Si thin film transistor technology and becoming the mainstream in the new generation of display technique.

Referring to FIG. 1, which is a structural schematic view illustrating a traditional LTPS array substrate. As illustrated in FIG. 1, a LTPS array substrate 100 in prior art mainly comprises: a substrate 101, a light shading layers 102, a buffer layer 103, a polysilicon layer 104, a gate insulating layer 105, gate electrode 106, source electrode/drain electrode 107 and a common electrode 108. A thin film transistor is composed of the polysilicon layer 104, a gate insulating layer 105, gate electrode 106 and source electrode/drain electrode 107. Referring to FIG. 2, which is a structural schematic view illustrating a traditional CMOS LTPS array substrate. As illustrated in FIG. 2, the array substrate comprises an N-Mental-Oxide-Semiconductor (NMOS, which is on the left side) and a P-Mental-Oxide-Semiconductor (PMOS, which is on the right side) disposed on the substrate 101. And as illustrated in FIG. 2, the light shading layers 102 between patterns are separate in the traditional CMOS LTPS array substrate.

In the manufacture procedure of the above-mentioned LIPS array substrate, first need to deposit a light shading layer, a buffer layer, an active layer, a gate insulating layer and a gate layer; and then, after depositing the gate insulating layer, need to deposit a film layer of the gate layer and define patterning of the gate layer. Therefore, the manufacture procedure is complex and leads to high production costs.

As a result, it is necessary to provide a new thin film transistor array substrate and manufacturing method thereof to solve the problems existing in the conventional technologies.

SUMMARY OF THE INVENTION

The first object of the present invention is to provide a manufacturing method of LTPS array substrate, comprising: step S10, providing a transparent substrate, depositing a layer of metal and patterning the layer of metal to obtain a metal mask layer; step S20, forming a buffer layer on the metal mask layer; step S301, depositing Amorphous Silicon on the buffer layer, forming a polysilicon layer after performing an excimer laser annealing process, performing a photolithographic operation for patterning to obtain an active layer; step S302, doping the active layer to make the active layer having a channel region, a source electrode contact region and a drain electrode contact region; step S40, forming a gate insulating layer on the active layer; step S501, coating a photoresist layer on the gate metal layer, performing a back-exposure of the photoresist layer twice using the metal mask layer as a photomask to form a patterned photoresist layer; and step S502, performing a dry etching process after developing to obtain a gate pattern for forming a gate layer.

In one embodiment of the present invention, in the step S501, the photoresist layer is back exposed twice by lights that have equal incident angle in opposite directions, and a width of a photoresist of the patterned photoresist layer formed in the step 501 is smaller than a width of the channel region.

In one embodiment of the present invention, the manufacturing method further comprises at least: step 60, performing a LDD light doping process on the active layer by implanting ions.

In one embodiment of the present invention, both the source electrode contact region and the drain electrode contact region are p-type doped regions, or alternatively, both the source electrode contact region and the drain electrode contact region are N-type doped regions.

The second object of the present invention is to provide a manufacturing method of LTPS array substrate, wherein the LTPS array substrate contains at least a metal mask layer, a buffer layer, an active layer, a gate insulating layer and a gate layer. The manufacturing method is to form the gate layer by patterning the gate layer using the metal mask layer as a photomask, and a width of the formed gate layer is smaller than a width of the metal mask layer so that a vertical projection of the gate layer falls within the scope of the metal mask layer.

In one embodiment of the present invention, the manufacturing method comprises at least: step S10, providing a transparent substrate, depositing a layer of metal and patterning the layer of metal to obtain the metal mask layer; step S20, forming the buffer layer on the metal mask layer; step S30, forming the active layer on the buffer layer; step S40, forming the gate insulating layer on the active layer; and step S50, depositing a gate metal layer on the gate insulating layer, and forming the gate layer after twice back exposing by using the metal mask layer as a photomask.

In one embodiment of the present invention, the step S50 comprises: step S501, coating a photoresist layer on the gate metal layer, performing a back-exposure of the photoresist layer twice using the metal mask layer as a photomask to form a patterned photoresist layer; and step S502, performing a dry etching process after developing to obtain a gate pattern for forming a gate layer.

In one embodiment of the present invention, in the step S501, the photoresist layer is back exposed twice by lights that have equal incident angle in opposite directions.

In one embodiment of the present invention, the step S30 comprises: step S301, depositing Amorphous Silicon on the buffer layer, forming a polysilicon layer after performing an excimer laser annealing process, performing a photolithographic operation for patterning to obtain the active layer; step S302, doping the active layer to make the active layer having a channel region, a source electrode contact region and a drain electrode contact region.

In one embodiment of the present invention, a width of a photoresist of the patterned photoresist layer formed in the step 501 is smaller than a width of the channel region.

In one embodiment of the present invention, the manufacturing method further comprises at least: step 60, performing a LDD light doping process on the active layer by implanting ions.

In one embodiment of the present invention, both the source electrode contact region and the drain electrode contact region are p-type doped regions, or alternatively, both the source electrode contact region and the drain electrode contact region are N-type doped regions.

In one embodiment of the present invention, the metal mask layer is selected from molybdenum, the buffer layer is selected from SiNx or SiOx, and the gate insulating layer is selected from SiNx or $SiO_2$.

In one embodiment of the present invention, the gate layer is selected from a transparent gate metal layer or a metal oxide gate layer.

In the present invention, the cost of producing a metal mask for the gate electrode is saved by patterning the gate layer using the metal mask layer as a photomask, so that the cost of producing LTPS is saved and the process of production is simplified.

The manufacturing method according to the present invention can be applied to designs and productions in the field of mobile terminal displays. And the manufacturing method according to the present invention is not only suitable for the designs of TFT backplanes, but also suitable for the designs of CMOS/NMOS/Top Gate, other display structures like IPS and In-Cell Touch technologies.

DESCRIPTION OF THE INVENTION

Embodiments, for purposes of explanation, are set forth in order to provide a thorough understanding of the present invention and not to limit the technical solution of the present invention. Directional terms described by the present invention, such as upper, lower, front, back, left, right, inner, outer, side, and etc., are only directions by referring to the accompanying drawings. And thus, the used directional terms are used to describe and understand the present invention, but the present invention is not limited thereto. In particularly, for conveniently describing, FIG. 5 is shown in simplification, wherein the number of the traces is simplified and some of details which are unrelated to the description are also omitted.

Example 1

A manufacturing method of LTPS array substrate is provided. The manufacturing method is described in detail hereinafter by referring to the FIGS. 4, 5A-5C and 6.

As illustrated in figures, the manufacturing method comprises the following steps.

Figure 3:
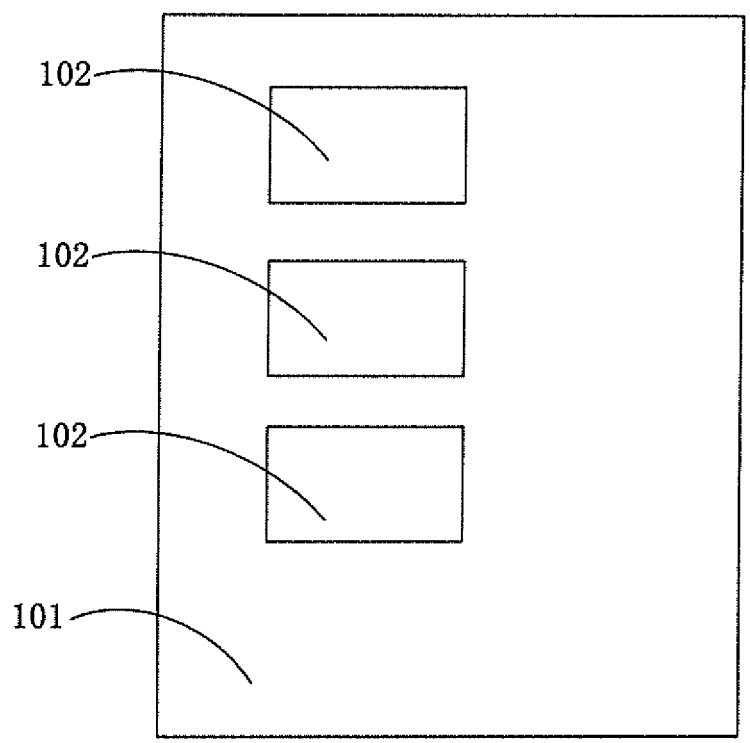
FIG. 3 is a top view of a light filtering layer in the traditional CMOS LTPS array substrate.
Figure 4:
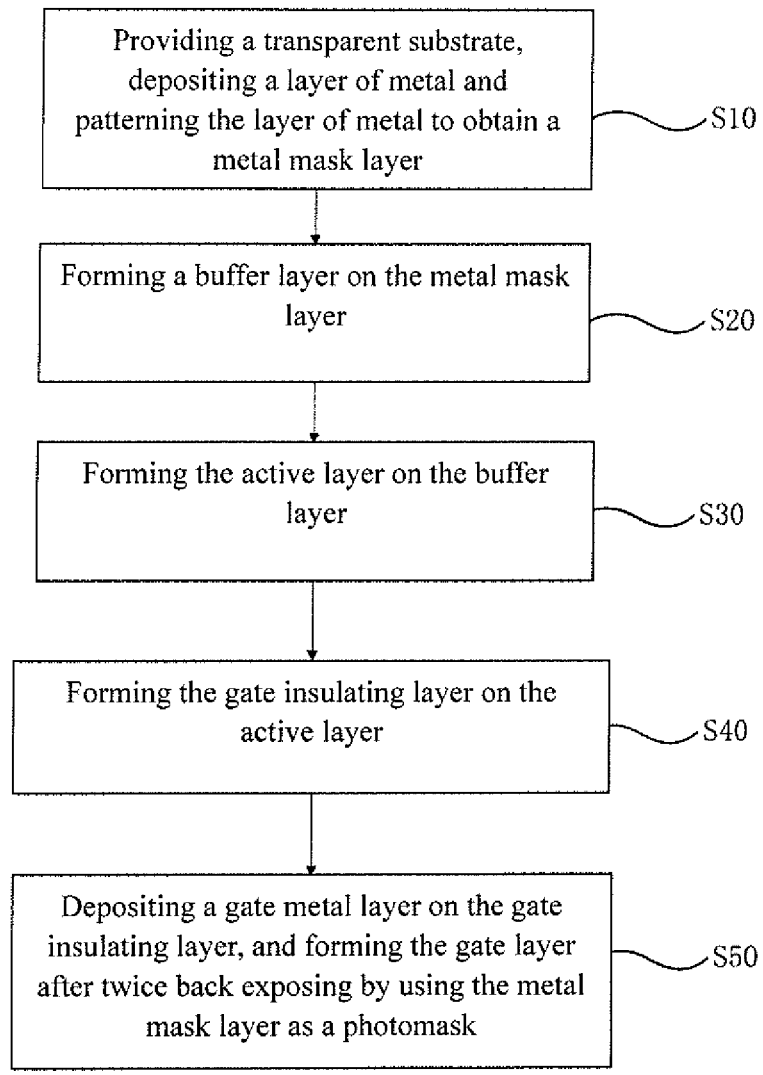
FIG. 4 is a schematic view illustrating a process flow of producing method for the LTPS array substrate according to the present invention.
Figure 5A:
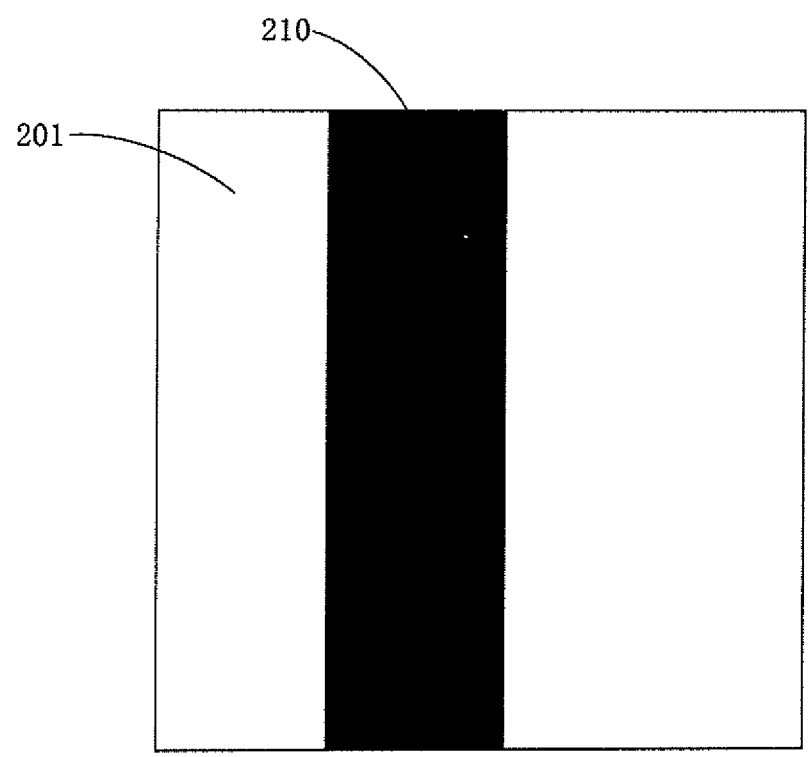
FIGS. 5A-5C are top views of the LTPS array substrate during the producing process of the LTPS array substrate according to the present invention.

Step S10, providing a transparent substrate 201, wherein the transparent substrate 201 is usually a transparent glass substrate. Depositing a layer of metal on the transparent substrate 201 and patterning the layer of metal by using a photolithography process to obtain a metal mask layer 210. As illustrated in FIGS. 3 and 5A, the light shading layers 102 between patterns are separate in the traditional CMOS LTPS array substrate, while the metal mask layer 210 between patterns is continuous in the present invention. The metal mask layer 210 is selected from molybdenum.

Figure 5B:
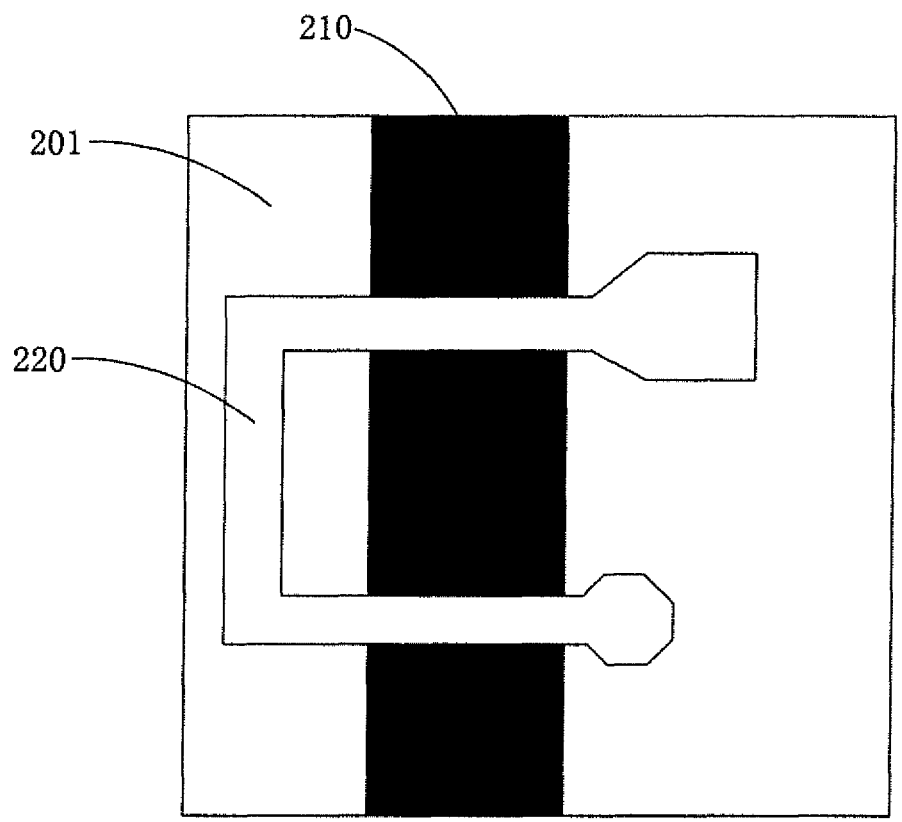

Step S20, forming a buffer layer 220 on the metal mask layer 210, so that the buffer layer 220 covers the metal mask layer 210, as illustrated in FIG. 5B. The buffer layer 220 is selected from SiNx or SiOx.

Figure 5C:
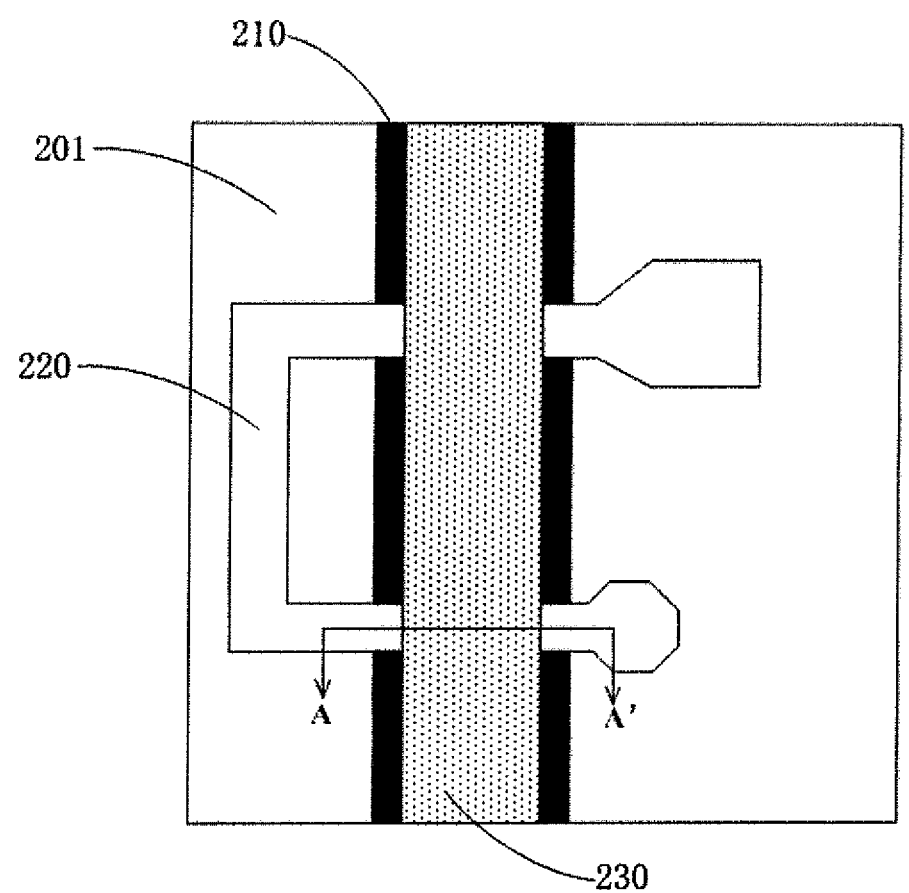

Step S30, forming an active layer 230 on the buffer layer 220 and then patterning the active layer 230, as illustrated in FIG. 5C. This step comprises the following two sub-steps: step S301, firstly, depositing amorphous silicon on the buffer layer 220 and carrying out a dehydrogenization process of the amorphous silicon layer by using a high temperature oven for preventing hydrogen decrepitation occurred during crystallization and reducing the effects of defect states density in the film after crystallization. Performing a LTPS process after completing dehydrogenization process, crystallizing the amorphous silicon layer by a crystallization method such as excimer laser anneal technology (ELA), metal induced crystallization technology (MIC) and solid phase crystallization technology (SPC) to form a polysilicon layer on the buffer layer 220. Secondly, patterning the polysilicon layer by performing a photolithographic operation to form a patterned active layer 230 on the buffer layer 220. And step S302, doping the active layer 230 (by ion implantation) to make the active layer having a channel region 231, a source electrode contact region 232 and a drain electrode contact region 233, wherein both the source electrode contact region 232 and the drain electrode contact region 233 are p-type doped regions, or alternatively, N-type doped regions.

Figure 6:
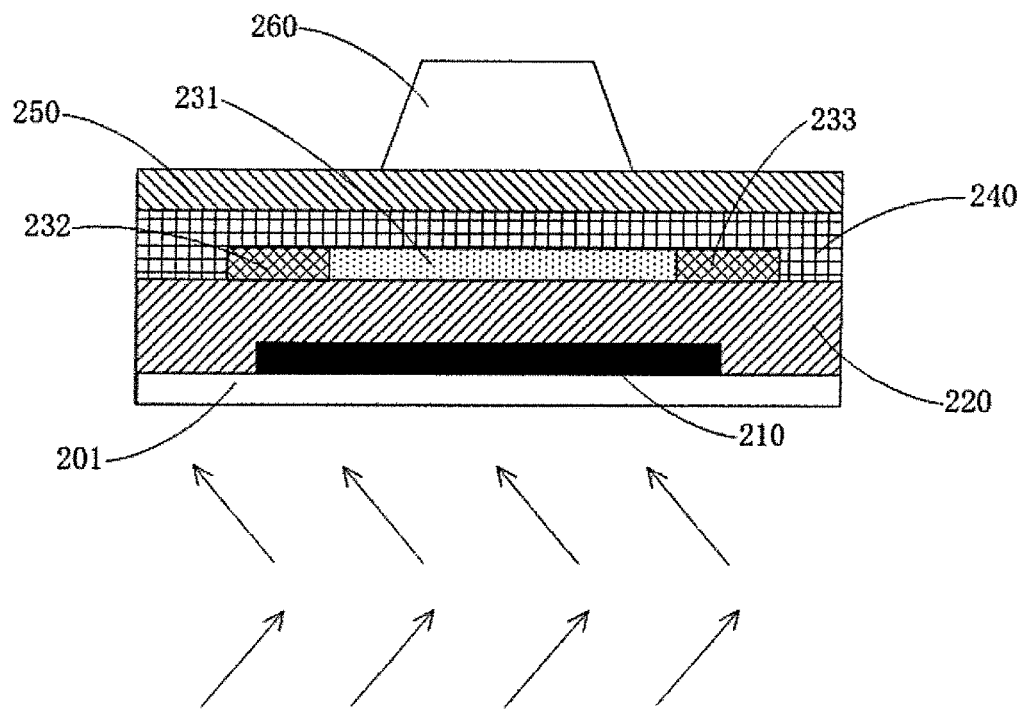
FIG. 6 is a cross-sectional view taken along the line A-A' in FIG. 5C.

Step S40, forming a gate insulating layer 240 on the active layer 230, wherein the gate insulating layer 240 is selected from SiNx or $SiO_2$; and, Step S50, depositing a gate metal layer on the gate insulating layer 240, and forming the gate layer 250 after twice back exposing by using the metal mask layer 210 as a photomask. The gate layer 250 is selected from a transparent gate metal layer or a metal oxide gate layer, such as ITO. The step S50 comprises: step S501, coating a photoresist layer on the gate metal layer, performing a back-exposure of the photoresist layer twice using the metal mask layer 210 as a photomask to form a patterned photoresist layer 260, wherein the lights are in different directions as illustrated in FIG. 6. And more specifically, as illustrated in FIG. 6, the lights used in the twice back-exposure as have equal incident angle in opposite directions, that is, the acute angles between the lights and the transparent substrate 201 are the same. For example, the first back-exposure is shown as arrows in first row, wherein the transparent substrate 201 is back exposed under parallel lights that form a certain angle with the transparent substrate 201, while the second back-exposure is shown as arrows in second row; the absolute values of the angles of the twice back-exposure are the same, so that the acute angles on both sides of the photoresist in the patterned photoresist layer 260 are the same. Since the metal mask layer 210 is used as a photomask, the width of a photoresist of the patterned photoresist layer 260 is smaller than a width of the channel region 231 on the active layer 230. And step S502, performing a dry etching process after developing to obtain a gate pattern for forming a gate layer 250.

Use Example

In the present example, the method provided in EXAMPLE 1 is applied to a manufacture procedure of a CMOS LTPS array substrate. Therefore, in the present example, steps S10 to S50 described in the EXAMPLE 1 are performed followed by the following steps.

Figure 7:
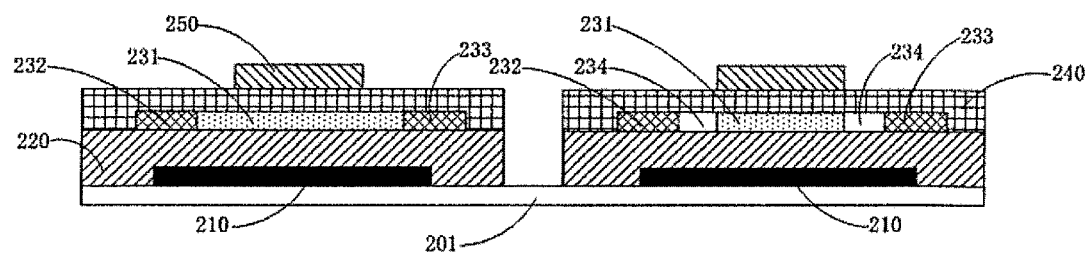
FIG. 7 is a structural schematic view illustrating a CMOS LTPS array substrate obtained by the manufacturing method according to the present invention in a use example.

Step S60, performing a LDD light doping process on the active layer 230 by implanting ions. As illustrated in FIG. 7, light doped drain (LDD) is formed between the channel region 231 and the source electrode contact region 232 and between the channel region 231 and drain electrode contact region 233. It is certain that followed by the step 60, the manufacture procedure further comprises: forming an interlayer insulating layer on the gate layer; forming a source/drain layer on the interlayer insulating layer; and, forming a planarizing layer, a common electrode layer, an insulating layer and a pixel electrode layer in turn. The above-mentioned steps are conventional steps in the field and hence are not further described here.

Figure 1:
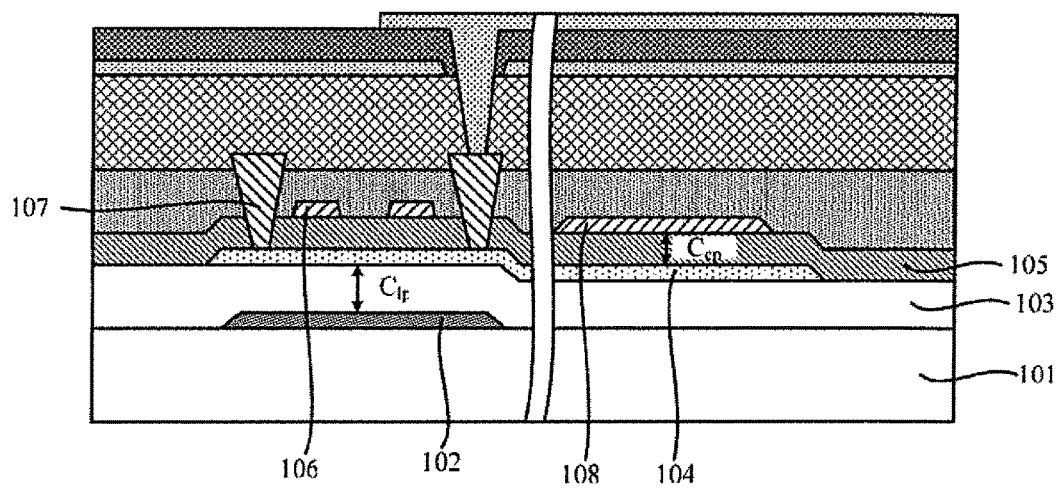
FIG. 1 is a structural schematic view illustrating a traditional LTPS array substrate.
Figure 2:
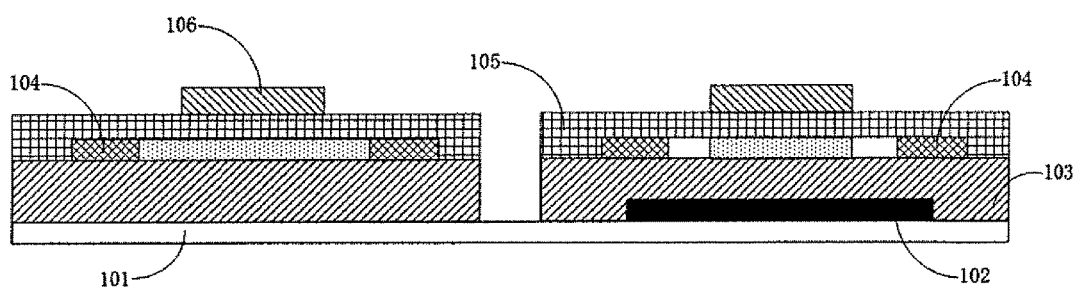
FIG. 2 is a structural schematic view illustrating a traditional CMOS LTPS array substrate.

Referring now to the FIG. 7, which is a structural schematic view illustrating a CMOS LTPS array substrate obtained in the present use example. As illustrated in the FIG. 2, a conventional CMOS LTPS array substrate comprises NMOS and PMOS, wherein the panel AA region is NMOS while the peripheral GOA region comprises NMOS and PMOS, and the light shading layers 102 is not required in the PMOS. However, as illustrated in FIG. 7, the PMOS in the CMOS LTPS array substrate (which is on the left side) obtained in the present use example comprises a metal mask layer 210, in order to ensure that the gate electrode of the PMOS can be patterned through back exposing by using the metal mask layer 210 as a photomask.

In the present invention, the cost of producing a metal mask for the gate electrode is saved by patterning the gate layer using the metal mask layer as a photomask, so that the cost of producing LTPS is saved and the process of production is simplified.

The manufacturing method according to the present invention can be applied to designs and productions in the field of mobile terminal displays. And the manufacturing method according to the present invention is not only suitable for the designs of TFT backplanes, but also suitable for the designs of CMOS/NMOS/Top Gate, other display structures like IPS and In-Cell Touch technologies.

The present invention has been described with relative embodiments which are examples of the present invention only. It should be noted that the embodiments disclosed are not the limit of the scope of the present invention. Conversely, modifications to the scope and the spirit of the claims, as well as the equal of the claims, are within the scope of the present invention.

What is claimed is:
1. A manufacturing method of LIPS array substrate, comprising:
Step S10, providing a transparent substrate, depositing a layer of metal and patterning the layer of metal to obtain a metal mask layer;
Step S20, forming a buffer layer on the metal mask layer;
Step S301, depositing Amorphous Silicon on the buffer layer, forming a polysilicon layer after performing an excimer laser annealing process, performing a photolithographic operation for patterning to obtain an active layer;
Step S302, doping the active layer to make the active layer having a channel region, a source electrode contact region and a drain electrode contact region;
Step S40, forming a gate insulating layer on the active layer;
Step S50, depositing a gate metal layer on the gate insulating layer;
Step S501, coating a photoresist layer on the gate metal layer, performing a back-exposure of the photoresist layer twice using the metal mask layer as a photomask to form a patterned photoresist layer; and
Step S502, performing a dry etching process after developing to obtain a gate pattern for forming a gate layer.

2. The manufacturing method according to claim 1, wherein in the step S501, the photoresist layer is back exposed twice by lights that have equal incident angle in opposite directions, and a width of a photoresist of the patterned photoresist layer formed in the step 501 is smaller than a width of the channel region.

3. The manufacturing method according to claim 2, wherein the manufacturing method further comprises at least: step 60, performing a LDD light doping process on the active layer by implanting ions.

4. The manufacturing method according to claim 2, wherein both the source electrode contact region and the drain electrode contact region are p-type doped regions, or alternatively, both the source electrode contact region and the drain electrode contact region are N-type doped regions.

5. The manufacturing method according to claim 1, wherein the metal mask layer is selected from molybdenum, the buffer layer is selected from SiNx or SiOx, and the gate insulating layer is selected from SiNx or $SiO_2$.

6. The manufacturing method according to claim 1, wherein the gate layer is selected from a transparent gate metal layer or a metal oxide gate layer.

7. A manufacturing method of LTPS array substrate, wherein the ups array substrate contains at least a metal mask layer, a buffer layer formed on the metal mask layer, an active layer formed on the buffer layer, agate insulating layer formed on the active layer, and a gate layer formed on the gate insulating layer, and wherein the manufacturing method is to form the gate layer by patterning the gate layer using the metal mask layer as a photomask, and a width of the formed gate layer is smaller than a width of the metal mask layer so that a vertical projection of the gate layer falls within the scope of the metal mask layer.

8. The manufacturing method according to claim 7, wherein the manufacturing method comprises at least:
Step S10, providing a transparent substrate, depositing a layer of metal and patterning the layer of metal to obtain the metal mask layer;
Step S20, forming the buffer layer on the metal mask layer;
Step S30, forming the active layer on the buffer layer;
Step S40, firming the gate insulating layer on the active layer; and
Step S50, depositing, a gate metal layer on the gate insulating layer, and forming the gate layer after twice back exposing by using, the metal mask layer as a photomask.

9. The manufacturing method according to claim 8, wherein the step SM) comprises:
Step S501, coating a photoresist layer on the gate metal layer, performing a back-exposure of the photoresist layer twice using the metal mask layer as a photomask to form a patterned photoresist layer; and Step S502, performing a dry etching process after developing to obtain a gate pattern for forming a gate layer.

10. The manufacturing method according to claim 9, wherein in the step S501, the photoresist layer is back exposed twice by lights that have equal incident angle in opposite directions.

11. The manufacturing method according to claim 9, wherein the step S30 comprises:

Step S301, depositing Amorphous Silicon on the buffer layer, forming a polysilicon layer after performing an excimer laser annealing process, performing a photolithographic operation for patterning to obtain the active layer;

Step S302, doping the active layer to make the active layer having a channel region, a source electrode contact region and a drain electrode contact region.

12. The manufacturing method according to claim 11, wherein a width of a photoresist of the patterned photoresist layer formed in tire step 501 is smaller than a width of the channel region.

13. The manufacturing method according to claim 11, wherein the manufacturing method further comprises at least:

step 60, performing a LDD light doping process on the active layer by implanting ions.

14. The manufacturing method according to claim 11, wherein both the source electrode contact region and the drain electrode contact region are p-type doped regions, or alternatively, both the source electrode contact region and the drain electrode contact region are N-type doped regions.

* * * * *